(12) United States Patent
Ruffieux

(10) Patent No.: US 8,264,292 B2
(45) Date of Patent: Sep. 11, 2012

(54) DEVICE AND METHOD FOR COMPENSATING FOR A RESONATOR

(75) Inventor: David Ruffieux, Lugnorre (CH)

(73) Assignee: CSEM Centre Suisse d'Electronique et de Microtechnique SA Recherche et Developpement, Neuchatel (CH)

( * ) Notice: Subject to any disclaimer, the term of this patent is extended or adjusted under 35 U.S.C. 154(b) by 0 days.

(21) Appl. No.: 12/920,557

(22) PCT Filed: Mar. 5, 2009

(86) PCT No.: PCT/EP2009/052624
§ 371 (c)(1),
(2), (4) Date: Sep. 1, 2010

(87) PCT Pub. No.: WO2009/112427
PCT Pub. Date: Sep. 17, 2009

(65) Prior Publication Data
US 2011/0012686 A1    Jan. 20, 2011

(30) Foreign Application Priority Data
Mar. 10, 2008    (EP) .................................. 08152548

(51) Int. Cl.
*H03B 5/32* (2006.01)
(52) U.S. Cl. .............. 331/158; 331/116 R; 331/116 FE; 331/176
(58) Field of Classification Search .................. 331/158, 331/116 R, 116 F, 176, 74 E, 116 FE, 74
See application file for complete search history.

(56) References Cited

U.S. PATENT DOCUMENTS

| | | | |
|---|---|---|---|
| 6,515,548 B2* | 2/2003 | Matsumoto et al. | 331/25 |
| 6,559,731 B2* | 5/2003 | Jakobsson | 331/176 |
| 6,696,899 B2 | 2/2004 | Ruffieux | |
| 7,791,419 B1* | 9/2010 | Lemkin | 331/47 |
| 2005/0151592 A1 | 7/2005 | Partridge et al. | |

FOREIGN PATENT DOCUMENTS

| | | |
|---|---|---|
| EP | 1265352 A1 | 12/2002 |
| EP | 1304804 A | 4/2003 |
| EP | 1475885 A | 11/2004 |
| JP | 58173488 A | 10/1983 |
| JP | 59105720 A | 6/1984 |

OTHER PUBLICATIONS

International Search Report, dated Jun. 6, 2009, from corresponding PCT application.
European Search Report, dated Sep. 16, 2008, from corresponding PCT application.

(Continued)

*Primary Examiner* — Arnold Kinkead
(74) *Attorney, Agent, or Firm* — Young & Thompson

(57) ABSTRACT

A device for compensating for the frequency of a resonator includes (a) a temperature sensor, (b) a sequencer determining a second compensation signal on the basis of the temperature and corresponding to a positive value N, and a third compensation signal on the basis of the temperature corresponding to a ratio between a positive integer S and N, S being lower than or equal to N, and (c) a variable counter receiving the compensation signals and generating a fourth output signal every N periods of a clock signal from the resonator and generating a fifth signal for modifying the charge capacity of the resonator.

14 Claims, 3 Drawing Sheets

OTHER PUBLICATIONS

Lanfranchi D. et al., "A Microprocessor-Based Analog Wristwatch Chip with 3 Seconds/Year Accuracy," 1994 IEE Solid-State Circuits Conference, Digest of Technical Papers, ISSCC94/Session 5/Technology Directions: Low-Power Technology /Paper WP 5.6, Feb. 16, 1994, p. 92-93, International Search Report and European Search Report.

* cited by examiner

DEVICE AND METHOD FOR COMPENSATING FOR A RESONATOR

TECHNICAL FIELD

The present invention relates to the field of heating compensation devices for piezoelectric or electrostatic resonators arranged in oscillators.

It more particularly concerns an electronic device making it possible to compensate for the thermal drift of the frequency of a silicon piezoelectric or electrostatic resonator with the aim of ensuring the stability of its reference frequency.

BACKGROUND OF THE INVENTION

The article by D. Lanfranchi et al., "A Microprocessor-Based Analog Wristwatch Chip with 3 Seconds/Year Accuracy", IEEE 1994, describes a circuit making it possible to increase the stability of the nominal frequency of a quartz-type resonator typically having a frequency equal to 32 kHz. An oscillator is connected to this resonator. A dual-frequency operating mode of the resonator is provided: the frequency adjustment is done by proceeding with a switching of a capacity added to the structure of the oscillator, by an external reference signal. Thus the oscillator, qualified as dual-frequency, can oscillate at two different frequencies: a first frequency greater than the nominal frequency and a second frequency lower than the nominal frequency. A ratio can be defined between the respective average times that the oscillator spends at the two high and low frequencies, corresponding to the first higher frequency and the second lower frequency, respectively. This ratio is adjusted using a reference signal. This reference signal can derive either from a more precise second resonator or from a temperature sensor. The more precise resonator can be used intermittently. However, it consumes too much to play the role of a time base serving to maintain a real time clock (RTC). Furthermore, the use of two resonators is not compatible with a concern for maximum miniaturization of the electronic devices.

It may therefore be preferable to obtain the time base by integrating a silicon-type low frequency resonator, combined with a temperature sensor. For example, document JP 58 173488 discloses a thermal compensating device for a dual-frequency oscillator, implementing a counter allowing a periodic modification of the frequency of the resonator as a function of the measured temperature, and therefore a temperature compensation of the output frequency.

However, a so-called dual-frequency mode device only makes it possible to compensate the variations of the resonator's frequency as a function of the temperature on a scale corresponding to the so-called draw difference between the high frequency and the low frequency. The variation of the frequency of a silicon resonator, as a function of the temperature, is close to 30 parts per million (ppm) per degree Celsius. It has been shown that one could obtain a draw in the vicinity of 100 ppm for a resonator of this type. The silicon resonator can then only be compensated over a range of about 3 degrees Celsius, which is insufficient for an industrial application.

In document EP 1 475 885, a thermal compensation similar to that proposed by document JP 58 173488 is done but, furthermore, a variable frequency divider is placed on the outlet of the oscillator, the measured temperature acting, via a compensating circuit, on a bank of switchable capacities controlled digitally (or on a variable capacity controlled by a digital-analog converter) and also on the division factor of the divider. Thus, the temperature compensation range is extended. However, the variable frequency divider is realized using a PLL, the N/M factor of which is close to the unit, which penalizes the consumption. Moreover, due to the non-linearity of the adjustment features, a calibration must be done at several different temperature points, making the device complex to implement.

The present invention proposes a temperature compensating device for a resonator making it possible to avoid these drawbacks.

BRIEF DESCRIPTION OF THE INVENTION

One object of the present invention is to provide a device making it possible to generate a programmable compensated frequency stable over an extended temperature range from a silicon-type piezoelectric resonator.

Another object of the present invention is to provide a method for electronic thermal compensation of the reference frequency of a silicon-type piezoelectric resonator.

More particularly, the invention concerns a device capable of compensating the manufacturing tolerances and the temperature drift of a reference frequency of a silicon-type piezoelectric resonator, generating a programmable compensated reference frequency Fref. The device comprises:
  a temperature sensor capable of measuring an operating temperature of the resonator and capable of providing a first signal corresponding to the temperature,
  a sequencer connected to the temperature sensor, the sequencer being capable of determining a second compensation signal, from the first signal and as a function of the temperature value, using calibration data intended to be stored in a storage means connected to the sequencer, the second signal corresponding to a positive value N, the sequencer being, moreover, capable of determining a third compensation signal, from the first signal and as a function of the temperature value, using calibration data intended to be stored in the storage means connected to the sequencer, the third signal corresponding to a ratio between a positive integer S and N, S being less than or equal to N,
  a variable counter connected to said sequencer and connected to an oscillator provided with said resonator, the variable counter being capable of receiving said compensation signals, capable of producing a fourth output signal every N periods of a clock signal coming from said resonator, and capable of detecting the state S, arranged to produce a fifth signal capable of modifying the load capacity of said oscillator.

According to the invention, N comprises an integer part Nint and a fractional part Nfrac, and the variable counter comprises:
  an accumulator connected to the outlet of the sequencer and capable of receiving a sixth signal corresponding to the fractional part of N,
  a Nint, Nint+1 dual-module counter connected to the outlet of the accumulator and to the outlet of the sequencer, capable of receiving a seventh signal corresponding to the integer part of N, and the outlet of which is the compensated reference frequency Fref,
  a counting element connected to the outlet of the sequencer and to the outlet of the dual-module counter, capable of receiving said third signal and said fourth signal, said counting element being capable of producing the fifth signal as a function of the state S.

The invention also concerns a method for compensating manufacturing tolerances and the temperature drift of a reference frequency of a silicon-type piezoelectric resonator comprising the following steps:

- turning on of a temperature sensor by a sequencer connected to said sensor,
- reading a first signal corresponding to an operating temperature measurement of the resonator, the first signal coming from the temperature sensor,
- determination by the sequencer of a second compensation signal from the first signal using calibration data stored in a storage means connected to the sequencer, the second signal corresponding to a positive value N,
- determination by the sequencer of a third compensation signal from the first signal using calibration data, the third signal corresponding to a ratio between a positive integer S and N, S being less than or equal to N,
- reception of the compensated signals by a variable counter connected to the sequencer and to an oscillator provided with the resonator,
- production of a fourth output signal by the variable counter every N periods of a clock signal coming from the resonator,
- detection of the state S less than or equal to N, with the aim or producing a fifth signal capable of modifying the load capacity of said oscillator.

BRIEF DESCRIPTION OF THE DRAWINGS

Other features of the present invention will appear more clearly upon reading the following description, done in reference to the appended drawing, in which.

DETAILED DESCRIPTION OF THE INVENTION

Out of a concern for clarity, same elements have been designated by the same references in the different figures.

Figure 1:
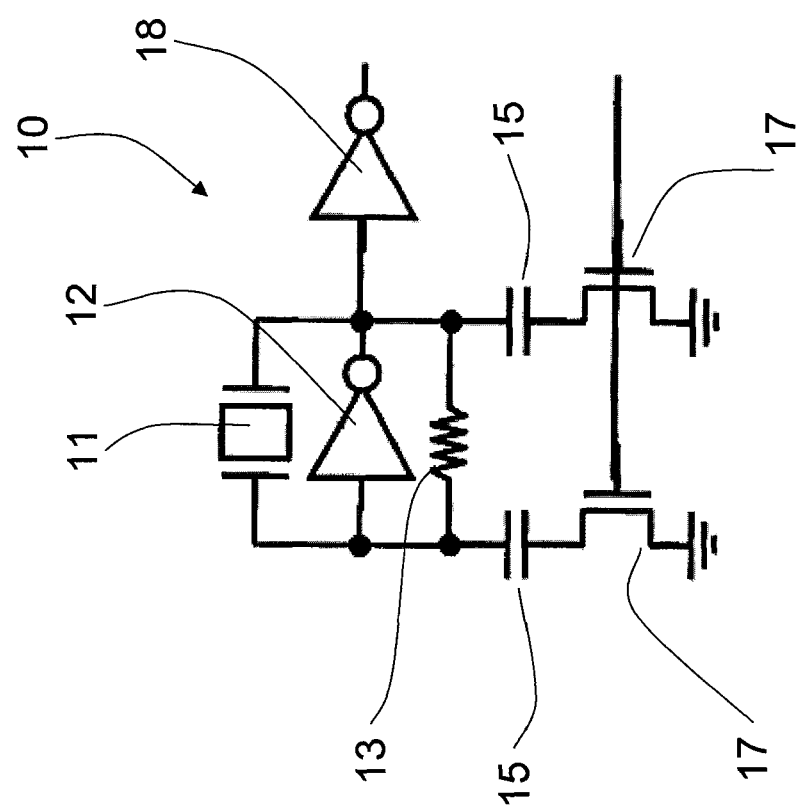
FIG. 1 shows an oscillator structure traditionally used in connection with a resonator.

FIG. 1 shows an example of an oscillator 10 connected to a piezoelectric resonator 11. The oscillator 10 comprises a first reverser 12 placed between the nodes of the resonator 11 and a polarization resistance 13 connected to the terminals of the oscillator 10. In the framework of a dual-frequency mode, the oscillator is connected to a bank of one or two switchable capacities 15: each of the two capacities 15 is connected to the mass by an interrupter than can be a MOS-type transistor 17. If the oscillator 10 is used as an outlet of a time base to maintain a real time clock, a second reverser 18 identical to the first reverser 12 is connected to said oscillator.

The oscillation frequency of the oscillator 10 can be made variable by adjusting the load capacity using the switchable capacities 15. In dual-frequency mode, we talk about draw difference. The frequency offset between the resonance frequency and the oscillation frequency of the resonator 11 corresponds to this draw. For example, the oscillation frequency depending (inversely proportionate) on the load capacity, the draw is therefore null for an infinite load capacity. One therefore understands that by acting on these load capacities, it is possible to modify the oscillation frequency so as to compensate a possible thermal drift.

Figure 2:
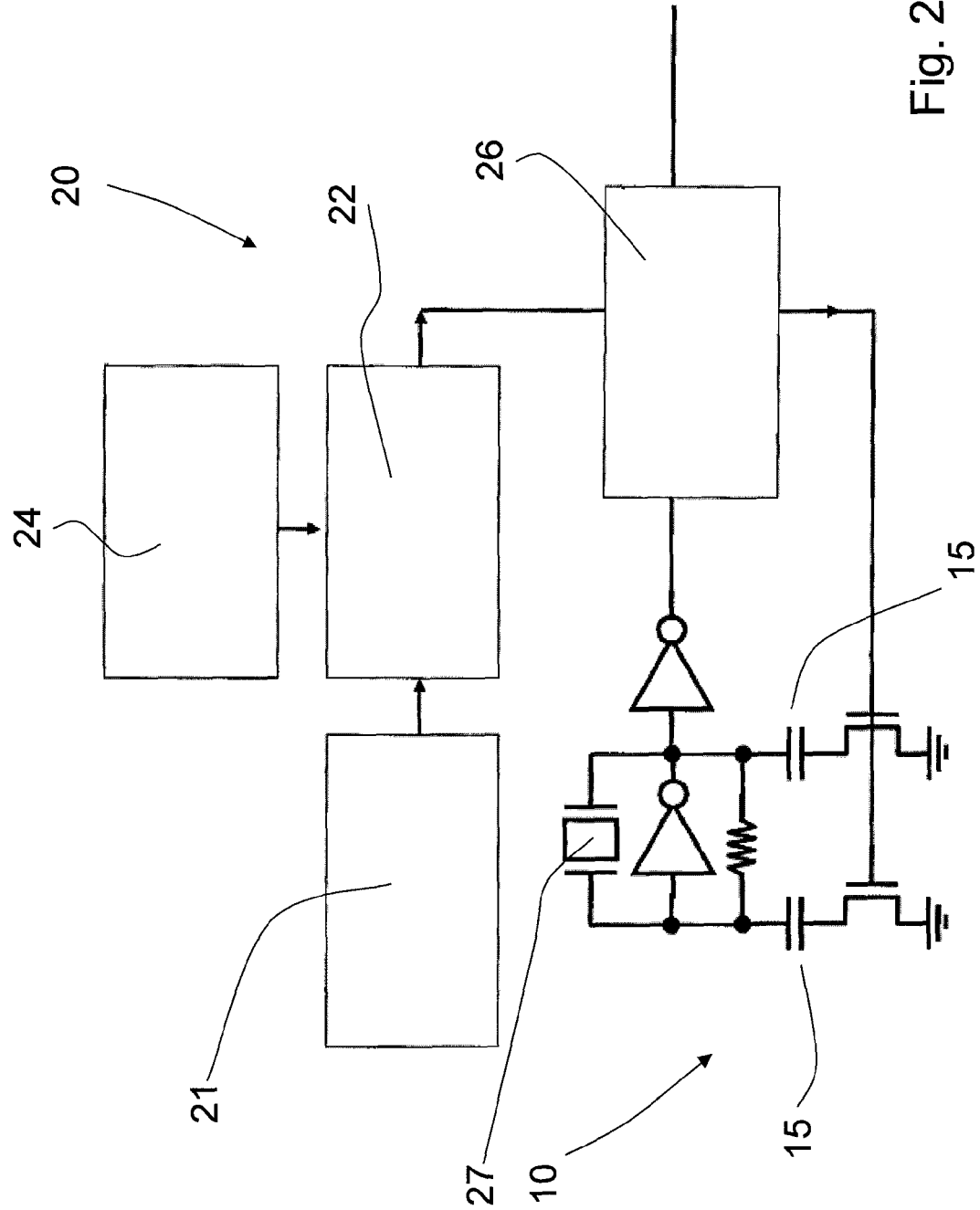
FIG. 2 shows a compensation device of a first embodiment according to the present invention.

FIG. 2 shows, according to a first embodiment of the invention, a device 20 capable of compensating the temperature drift of a reference frequency of a silicon-type piezoelectric resonator 27. It comprises a temperature sensor 21 connected to a sequencer 22 that can be a state machine or a microcontroller. The temperature sensor 21 can be a transducer capable of converting one form of energy into another form that can preferably be an electric measure. A memory 24, directly connected to the sequencer 22, makes it possible to store calibration data. The sequencer 22 is directly connected to a variable counter 26 that controls the switchable capacities 15 described in FIG. 1. The variable counter 26 is typically a variable frequency divider, i.e. the value used, for example a positive integer N, to divide a given frequency is configurable.

The temperature sensor 21 measures an operating temperature of the circuit at defined intervals and provides a first signal corresponding to the measured temperature. The sequencer 22 determines a second compensation signal integrating the value of the temperature, from the first signal using calibration data, the second signal representing the value N. Likewise, the sequencer 22 delivers a third signal representing a ratio between a positive integer S and the integer N, S being less than or equal to N. This ratio corresponds to an activity level. The variable counter 26 is activated by the second signal and the third signal. The counter 26 generates a fourth output signal, every N periods of a clock signal coming from the resonator 27. This counter 26 plays the role of a frequency divider that produces a cycle every N periods of the signal received as input. The fourth signal corresponds to the compensated reference frequency signal Fref. Moreover, the counter 26 has an additional function, i.e. that of detecting the state S. The counter thus produces a fifth signal capable of modifying the load capacity of the oscillator 10 to produce a high or low frequency signal. This fifth signal produces a value that changes as a function of the veracity of the inequality defined by the state S less than or equal to the state N. The activity level can thus be adjusted. This activity level corresponds to the average time that the oscillator 10 spends in low frequency during N cycles of the signal from the oscillator.

The frequency variations of the silicon-type resonator 27 as a function of the temperature can be the subject of an approximation by a linear-type function, the function also being able to be of a higher order. The parameters of that function can be stored in the memory 24. The function can be calculated by the sequencer 22 as a function of the first signal.

The sequencer 22 also starts the operation of the temperature sensor at defined intervals. The value of the temperature can, for example, correspond to an electrical voltage value, itself converted into a digital format using an analog digital converter. Using calibration data, the sequencer 22 will therefore calculate a register value that is applied on the variable counter 26 with the aim of changing the number of cycles to be counted as a function of the temperature value measured by the sensor. A register of 16 bits is typically used. When the activity level leaves an interval between 0 and 1, the number of cycles to be counted changes.

The linearized relative variation of the divided frequency, called df, as a function of a temperature deviation, noted $\Delta T$, of the value of the division rate N and the value of the activity level, called dc, is defined by the following equation:

$$df(\Delta T, N, dc) = \frac{\frac{f_o}{N} \cdot (1 + \alpha \cdot \Delta T + dc \cdot \Delta f_{HL}) - \frac{f_o}{N_o} \cdot (1 + dc_o \cdot \Delta f_{HL})}{\frac{f_o}{N_o} \cdot (1 + dc_o \cdot \Delta f_{HL})} \quad (1)$$

where $\Delta f_{HL}$ corresponds to the relative frequency deviation between the high and low frequencies, the coefficient $\alpha$ is the linear frequency variation coefficient of the resonator as a function of the temperature, $N_0$ is the division rate making it possible to compensate the manufacturing tolerances at the calibration temperature to obtain a given reference frequency, and $dc_0$ is the corresponding activity level, i.e. defined by the ratio between S and $N_0$.

The condition to compensate the linear drift of the silicon-type resonator is obtained by canceling the relative variation of the frequency. This corresponds to the following equation:

$$dc(\Delta T, N) = \frac{1}{\Delta f_{HL}}\left(\frac{N - N_o}{N_o} - \alpha \cdot \Delta T\right) + \frac{N}{N_o} \cdot dc_o \qquad (2)$$

The activity level dc is then obtained as a function of the division rate N and the temperature deviation $\Delta T$.

The device that is the object of the invention is controlled as follows: when the calculated value of the activity level leaves the admissible interval, i.e. between 0 and 1, an adjustment of the division rate is then ordered. The activity level is therefore recentered. The sequencer 22 calculates the value N and the activity level defined by the ratio between S and N according to equation (2).

Out of a desire to optimize the integration of the various electronic components, one can provide for integrating, on a same substrate in a semi-conductor material such as silicon, the sensor 21 and the resonator 27. Indeed, the CMOS technology allows it. One can also use two different substrates. They will then be assembled using the known "flip-chip" method while ensuring that the resonator is under vacuum. Although the two substrates are different, they are, preferably, formed by the same material, typically silicon, to have the same thermal conductivity and thereby avoid heat gradients.

Figure 3:
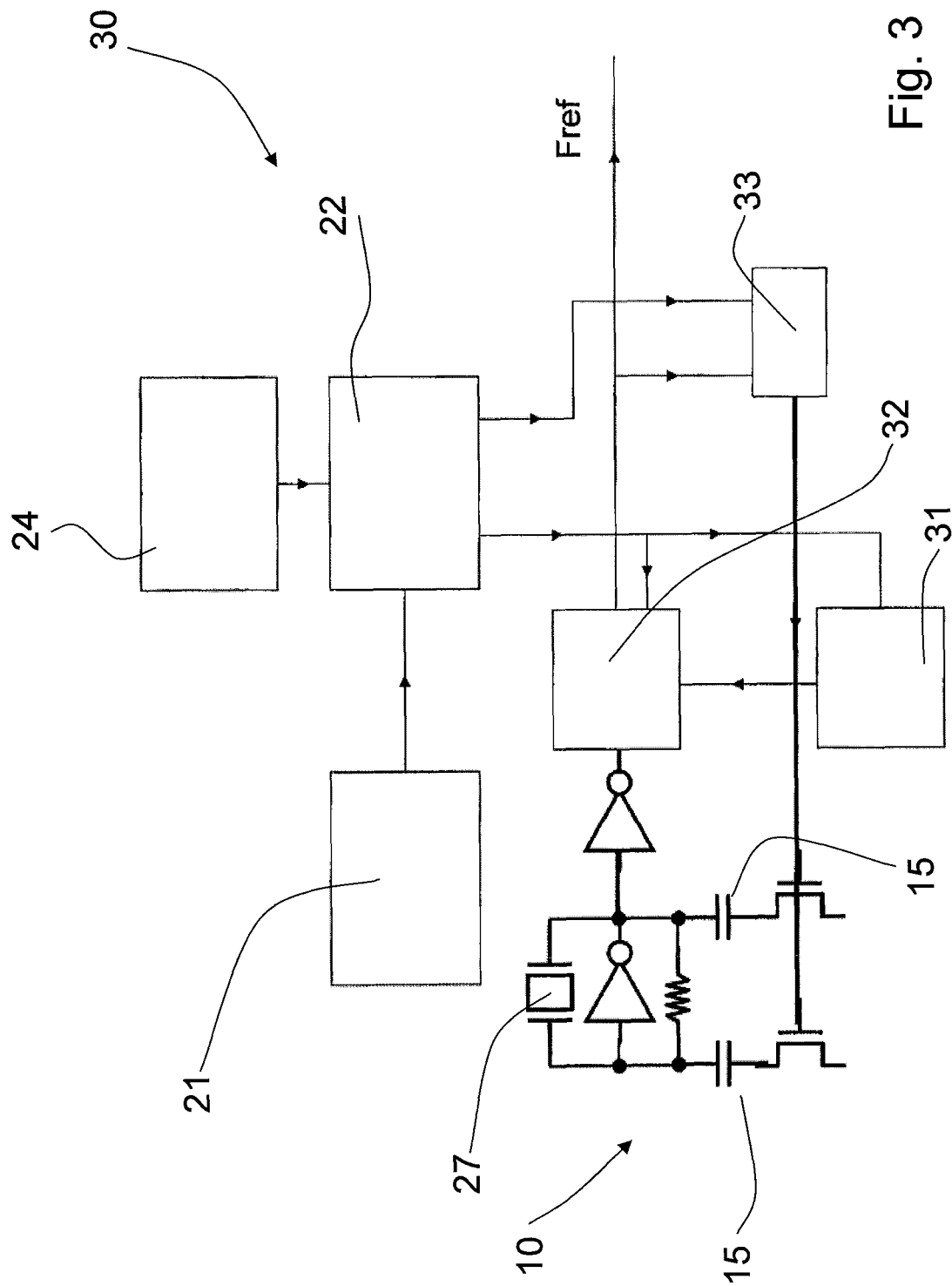
FIG. 3 shows a compensation device of a second embodiment according to the present invention.

FIG. 3 provides a second embodiment of a temperature compensating device for a frequency of a silicon-type resonator. Unlike the first embodiment shown in FIG. 2 and in which the compensated frequency is generated directly by whole division, the second embodiment makes it possible to generate, via a device 30, a compensated frequency that corresponds to a power of two multiplied by the compensated frequency obtained according to the first embodiment.

Comparably to the device 20 above, this device 30 comprises the temperature sensor 21 connected to the sequencer 22, and the memory 24 with the same function as before.

The sequencer 22 is connected to an accumulator 31 and a dual-module counter 32. The two elements 31 and 32 are connected to each other. The sequencer 22 is also connected to a counting element, which can in particular be a fixed counter 33 or an accumulator of first order or higher order. According to the example, the counting element is a fixed counter 33 dividing by M, whereof one of the output signals defined hereinafter activates the switched capacities 15 of the oscillator 10.

Like the device 20, the sequencer 22 determines the second signal representing the value N which, in the case of the device 30, is not an integer but includes a fractional part Nfrac. A sixth signal corresponding to the fractional part Nfrac of N activates the accumulator 31, which has the same number of bits as Nfrac. A seventh signal corresponding to the integer part Nint of N activates the dual-module counter 32. When it is full (carry output=1), the accumulator switches the dual-module counter to its higher value (Nint+1) without, however, storing (accumulating) this control bit. The accumulator 31 is typically a discrete integrating circuit with terminals.

As in the first embodiment, the sequencer delivers the third signal representing the ratio between S and M, S being less than or equal to M. The fixed counter 33 is activated by the third signal. The dual-module counter 32 generates the fourth output signal every Nint or Nint+1 periods of the clock signal coming from the resonator 27. This signal corresponds to the compensated reference frequency signal Fref defined above according to the diagram of FIG. 2, multiplied by $2^i$, i being the number of bits of Nfrac. The result is that the average frequency of the signal obtained over a Fref period is strictly equal to Fref. Moreover, the counter 33 has an additional function, i.e. that of detecting the state S less than the fixed value of the counter M. One of the abovementioned output signals is, as in the first embodiment, the fifth signal capable of modifying the load capacity of the oscillator 10 to produce a high or low frequency signal. This type of counter is typically a frequency divider, which divides the value of the frequency of an input signal by a fixed predetermined value. This fifth signal produces a value that changes as a function of the veracity of the inequality defined by the state S less than or equal to the state fixed by the counter 33. The activity level between the high frequency and the low frequency defined by the ratio between S and M is thus controlled owing to this counter 33.

As a digital example, the first embodiment can generate a frequency of 32 Hz from the silicon-type resonator 27 at 1 MHz. This frequency being very specific, it is advantageous to use the second embodiment making it possible to precisely generate the average frequency of a quartz resonator, i.e. 32768 Hz. Indeed, given that the exact frequency of a quartz resonator is directly equal to $2^{10}$ times 32 Hz, the division value of the counter 33 can be set at M=1024, i.e. $2^{10}$.

The proposed solution is therefore compatible with any type of device usually including a quartz and also makes it possible to generate any compensated reference frequency Fref less than the frequency of the silicon resonator by simple programming.

Of course, the present invention is open to various alternatives and modifications that will appear to those skilled in the art. In particular, it should be noted that other types of oscillators can be associated with a silicon-type piezoelectric or electrostatic resonator. As a non-limiting example, document EP 1 265 352 in the applicant's name can be cited, in which a differential oscillator is disclosed falling within the scope of the invention as defined in this application. Moreover, a dual-frequency mode was presented in the description. The invention would also work for a multi-frequency oscillator.

The invention claimed is:

1. A device capable of compensating for the manufacturing tolerances and the temperature drift of a reference frequency of a silicon-type resonator, generating a programmable compensated reference frequency Fref, comprising:

a temperature sensor capable of measuring an operating temperature of said resonator and capable of providing a first signal corresponding to the temperature, a sequencer connected to said temperature sensor, said sequencer being capable of determining a second compensation signal, from the first signal and as a function of said temperature value, using calibration data intended to be stored in a storage means connected to said sequencer, said second signal corresponding to a positive value N, said sequencer being, moreover, capable of determining a third compensation signal, from said first signal and as a function of the temperature value, using calibration data, said third signal corresponding to a ratio between a positive integer S and N, S being less than or equal to N, a variable counter connected to said sequencer and connected to an oscillator provided with said resonator, said variable counter—being capable of receiving said compensation signals, capable of producing a fourth output signal every N periods of a clock signal coming from said resonator, and capable of detecting the state S, arranged to produce a fifth signal capable of modifying the load capacity of said oscillator, wherein N comprises an integer part Nint and a fractional part Nfrac, and in that the variable counter comprises:

an accumulator connected to the outlet of the sequencer and capable of receiving a sixth signal corresponding to the fractional part of N, a Nint, Nint+1 dual-module counter connected to the outlet of the accumulator and to the outlet of the sequencer, capable of receiving a seventh signal corresponding to the integer part of N, and whereof the output is the compensated reference frequency Fref, a counting element connected to the outlet of the sequencer and to the outlet of the dual-module counter, capable of receiving said third signal and said fourth signal, said counting element being capable of producing the fifth signal as a function of the state S.

2. The device according to claim 1, wherein the oscillator is connected to a bank of two capacities each respectively connected to a transistor.

3. The device according to claim 1, wherein said device comprises an analog digital converter placed between said sensor and said sequencer and capable of converting said operating temperature into a digital voltage.

4. The device according to claim 2, wherein said device comprises an analog digital converter placed between said sensor and said sequencer and capable of converting said operating temperature into a digital voltage.

5. The device according to claim 1, wherein said sequencer is capable of starting said temperature sensor and capable of reading the signal corresponding to said temperature.

6. The device according to claim 2, wherein said sequencer is capable of starting said temperature sensor and capable of reading the signal corresponding to said temperature.

7. The device according to claim 3, wherein said sequencer is capable of starting said temperature sensor and capable of reading the signal corresponding to said temperature.

8. The device according to claim 4, wherein said sequencer is capable of starting said temperature sensor and capable of reading the signal corresponding to said temperature.

9. The device according to claim 1, wherein said sensor and said resonator are integrated on a same silicon substrate.

10. The device according to claim 2, wherein said sensor and said resonator are integrated on a same silicon substrate.

11. The device according to claim 3, wherein said sensor and said resonator are integrated on a same silicon substrate.

12. The device according to claim 5, wherein said sensor and said resonator are integrated on a same silicon substrate.

13. The device according to claim 1, wherein said sensor and said resonator are each respectively integrated on a silicon substrate, said two substrates being connected by "flip-chip".

14. A method for compensating for manufacturing tolerances and for the temperature drift of a reference frequency of a silicon-type piezoelectric resonator comprising the following steps:

turning on of a temperature sensor by a sequencer connected to said sensor, reading a first signal corresponding to an operating temperature measurement of said resonator, said first signal coming from the temperature sensor, determination by the sequencer of a second compensation signal from said first signal using calibration data intended to be stored in a storage means connected to said sequencer, the second signal corresponding to a positive value N, N comprising an integer part Nint and a fractional part Nfrac, determination by the sequencer of a third compensation signal from said first signal using calibration data, the third signal corresponding to a ratio between a positive integer S and N, S being less than or equal to N, reception of the compensated signals by a variable counter connected to the sequencer and to an oscillator provided with said resonator, the variable counter comprising:

an accumulator connected to the output of the sequencer and capable of receiving a sixth signal corresponding to the fractional part of N, a Nint, Nint+1 dual-module counter connected to the outlet of the accumulator and to the outlet of the sequencer, capable of receiving a seventh signal corresponding to the integer part of N, a counting element connected to the outlet of the sequencer and to the outlet of the dual-module counter, capable of receiving said third signal and said fourth signal, said fixed counter being capable of detecting the state S and producing the fifth signal as a function of the state S, production of a fourth output signal by the variable counter every N periods of a clock signal coming from said resonator, detection of the state S less than or equal to N, with the aim of producing a fifth signal capable of modifying the load capacity of said oscillator.

* * * * *